United States Patent [19]

Richardson et al.

[11] Patent Number: 4,625,331
[45] Date of Patent: Nov. 25, 1986

[54] AUTOMATIC FREQUENCY CONTROL SYSTEM OR AN SSB RECEIVER

[75] Inventors: Julian H. Richardson, Clevedon, England; Bruce C. Eastmond, Downers Grove, Ill.

[73] Assignee: Motorola, Inc., Schaumburg, Ill.

[21] Appl. No.: 618,609

[22] Filed: Aug. 17, 1984

[51] Int. Cl.[4] .................... H04B 7/00; H04B 1/68; H03J 7/22

[52] U.S. Cl. .................... 455/35; 455/164; 455/166; 455/203; 455/260

[58] Field of Search .................... 455/35, 47, 161, 164, 455/165, 166, 169, 203, 260, 265; 329/122, 124; 331/12, DIG. 2

[56] References Cited

U.S. PATENT DOCUMENTS

| | | |
|---|---|---|
| 3,100,871 | 8/1963 | Richardson et al. |
| 3,358,234 | 12/1967 | Stover ........................... 455/47 |
| 4,009,442 | 2/1977 | von Brömssen . |
| 4,013,964 | 3/1977 | Skutta . |
| 4,099,125 | 7/1978 | Bennett, Jr. et al. |
| 4,298,988 | 11/1981 | Dages . |
| 4,306,310 | 12/1981 | Malinowski et al. |
| 4,374,437 | 2/1983 | Citta et al. |
| 4,408,349 | 10/1983 | Yukawa . |
| 4,409,688 | 10/1983 | Baker . |
| 4,539,707 | 9/1985 | Jacobs et al. ........................ 455/47 |

OTHER PUBLICATIONS

Motorola, Inc., "Syntor TM Two-Way FM Radio", Manual No. 68P81043E45-O, Mar., 1980, p. 6 (paragraph 2.1.6.7.) and Schematic No. PEPS-29912-0.

The Potential of SSB for Land Mobile Radio; R. W. Gibson and R. Wells; 29th IEEE Vehicular Conference; 1979.

Land Mobile SSB: Promises and Problems; R. W. Gibson.

Problem of Speech Pulling and Its Implementation for the Design of Phase-Locked SSB Radio Systems; J. P. McGeehan and A. Lymer; Proc. IEE, Part F, vol. 128; Nov. 1981.

Elimination of False-Locking in Long Loop Phase Locked Receivers; J. P. McGeehan and J. P. H. Sladen; IEEE Transactions on Communications, vol. COM-30, No. 10; 10/1982.

Primary Examiner—Jin F. Ng
Attorney, Agent, or Firm—Raymond A. Jenski; James W. Gillman

[57] ABSTRACT

A frequency control circuit for a single sideband receiver is disclosed wherein the local oscillator is swept at a first rate to enable the acquisition of a transmitted signal. When the signal is acquired, the local oscillator is swept at a second rate in an indicated direction in order to center the signal. Upon centering, the local oscillator is maintained at a frequency which centers the signal in response to the activation of a squelch detector.

24 Claims, 7 Drawing Figures

AUTOMATIC FREQUENCY CONTROL SYSTEM OR AN SSB RECEIVER

BACKGROUND OF THE INVENTION

This invention relates generally to radio receiver frequency control systems and more particularly to an automatic frequency control (AFC) for a single sideband receiver to be used at frequencies designated for land mobile services.

In a single sideband radio system, the tolerable frequency error without significant loss of voice recognition or intelligibility is approximately ±20 Hz. Traditional means of controlling radio frequencies such as crystal frequency standards cannot alone maintain this close tolerance at frequencies greater than approximately 20 MHz. Typical crystal oscillator performance over the temperatures encountered in a mobile radio environment ranges from ±5 parts per million (ppm) to ±1 ppm. The cost of the ±1 ppm oscillator is inherently much greater than that of a ±5 ppm oscillator. Considering a VHF frequency of 150 MHz, these tolerances yield frequency errors of ±750 Hz and ±150 Hz respectively.

To resolve this frequency tolerance problem, continuous phase locked loop (PLL) techniques have been widely adopted among single sideband receiver designers Generally, PLL receiver AFC circuits are realized in a loop that includes a first mixer, an intermediate frequency (IF) filter and gain, product detector with associated reference oscillator, a loop filter, and a voltage controlled oscillator (VCO) which in turn accepts a frequency control voltage from the loop filter and produces the local oscillator (LO) signal for the first mixer. The received SSB signal is demodulated by the product detector. The received signal, which may incorporate a frequency error, is correctly located in the IF filter bandpass by means of the natural acquisition characteristics of the PLL. However, such a continuously controlled PLL exhibits a potential for degrading the adjacent channel interference performance as a result of noise which may be present on the VCO control line due to on-channel modulation or adjacent-channel interference. Various methods, such as dual-bandwidth and split loop techniques have been proposed to diminish the loop noise; however, these AFC techniques described previously may have further shortcomings such as poor demodulator performance when the received signal is subject to multipath signal propagation or inferior acquisition performance. For these reasons, the received AFC to be disclosed in further detail herein employs a directed frequency sweep of the LO in conjunction with a "short loop" phase-locked SSB demodulator following the IF filter and gain in order to maximize demodulator performance in a multipath signal environment, to ensure rapid frequency acquisition, and to eliminate LO noise problems.

Classical frequency sweep schemes utilize a low sweep frequency, usually less than one-half the square of the steady state detector PLL natural frequency, thereby permitting enough time for the acquisition and centering of the received signal or low signal levels. At this sweep frequency, however, the time to simply acquire and center the desired signal with the AFC loop becomes unacceptably long (up to 250 msec) and adds to the receiver squelch operation time such that the initial segments of the message may be lost.

In such classical sweep schemes, a lock detector is commonly used to determine when the desired signal, converted to an IF frequency by the swept local oscillator, falls within a predetermined window around the "centered" position in the IF bandpass. When the signal reaches this window, the local oscillator sweep is terminated and any remaining frequency error is typically irnored. The speed of the lock detector is important in acquiring lock; a slow lock indication may allow the signal to sweep past the centering window and not be centered while a fast lock indication may allow perturbations, like noise, to break lock or cause the detector to fail in initially acquiring the signal.

These conflicting lock detector requirements are reconciled by means of a dual time constant lock detector having the time required to sense the lock condition of the PLL significantly shorter than the time required to sense the unlock condition of the PLL. When this lock detector is utilized to control the sweep, squelch activation can begin before centering of the received signal is fully complete, thereby minimizing the time required for activation of the squelch.

It can be appreciated, then, that previous AFC circuits have required a series of compromises to enable their operation. The present invention enables independent optimization of the key AFC parameters and enables single sideband receivers to approach the performance of well-established frequency modulation receivers.

SUMMARY OF THE INVENTION

Therefore, it is an object of the present invention to provide a frequency sweep that allows a rapid acquisition of a received signal.

It is a further object of the present invention to retain AFC lock under conditions of noise and fading.

It is a further object of the present invention to begin squelch activation before centering of the received signal so as to minimize the time during which the audio signal is lost at the beginning of a received transmission.

Accordingly, these and other objects are achieved in the present frequency control system for a single sideband receiver. This invention utilizes one rate of local oscillator sweep to acquire a transmitted signal and, once the signal is acquired, a detector indicates the direction a second sweep rate moves the local oscillator frequency to center the signal in the IF bandpass. When the signal is centered, the local oscillator frequency is maintained at the frequency of centering in response to a detection of receiver squelch.

DETAILED DESCRIPTION OF THE PREFERRED EMBODIMENT

Figure 1:
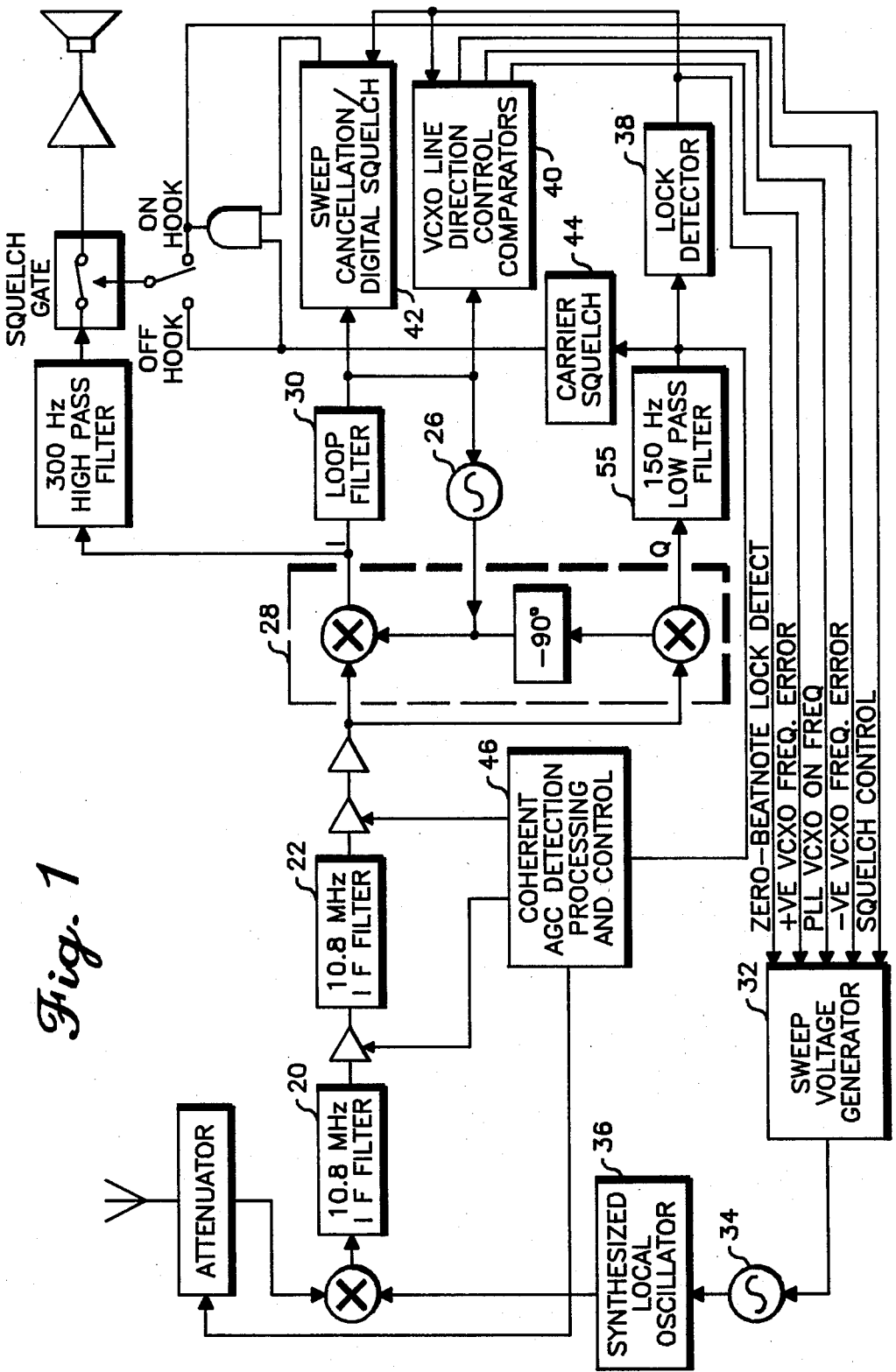
FIG. 1 is a block diagram of a single sideband receiver incorporating the present invention.

A single sideband receiver employing the automatic frequency control (AFC) circuit of the present invention is shown in FIG. 1. This receiver is a single conversion superheterodyne receiver which is utilized for frequencies in the range of 150 MHz to 175 MHz. An intermediate frequency (IF) of 10.8 MHz is used in the preferred embodiment and two four-pole upper sideband filters 20, 22, having passbands which include both the carrier and sideband modulation, are used to establish the selectivity of the receiver. A phased-locked loop (PLL) quadrature phase detector demodulator, which locks to the carrier and provides a coherent automatic gain control (AGC), consists of a 10.8 MHz voltage controlled crystal oscillator (VCXO) 26, a phase detector 28 having I and Q outputs, and a loop filter 30 arranged in conventional fashion. A disclosure of a similar phase-locked single sideband detector is given in U.S. Pat. No. 3,100,871 assigned to the assignee of the present application.

In practice, the operation of a PLL demodulator extends the frequency tolerance of the receiver to greater than the 20 Hz described earlier. This arises by virtue of the PLL lock range. Unfortunately, the useable range of frequency tolerance is insufficient to account for practical crystal reference oscillator instabilities under worst case conditions. In the preferred embodiment, the crystal oscillators have a $\pm 2$ parts per milion (ppm) stability which, when the stability of both the receiver and transmitter and considered, requires the receiver AFC acquisition range to be $\pm 4$ ppm or $\pm 700$ Hz at the 175 MHz operating frequency.

It is undesirable to increase the AFC range beyond a $\pm 700$ Hz to $\pm 900$ Hz range even though lower-priced crystal oscillators could be used in the system. This is because the additional frequency drift would, if permitted, allow transmitters on adjacent channels to operate closer together in frequency thereby exacerbating the serious existing problem of adjacent channel interference. With a nominal spacing of 5 KHz between channels, the adjacent channel interference protection degrades as much as 6 dB when the transmitters are as close as permitted by the use of $\pm 2$ ppm crystal oscillators. Greater degradation is experienced with crystal oscillators of greater stability ranges. This interference protection degradation applies to conventional transmitters and those with feedback phase and amplitude correction.

In addition to interference, closely spaced signals or an AFC with a wide lock range can cause a receiver to acquire and lock on a strong undesired adjacent channel. The required difference in level between desired and undesired signals which must be maintained so as to ensure that acquisition of the desired signal will always take place is referred to as the protection ratio. The protection ratio increases rapidly as the AFC range is increased and the frequency spacing between the desired and undesired transmitter frequencies becomes larger.

Another interference problem is that of cochannel interference. The AFC may acquire and lock on an undesired signal being transmitted on the channel and then be presented with a desired signal, perhaps offset in frequency from the undesired signal. The required difference in level between the desired and undesired signals which must be maintained to ensure that the receiver acquires and locks on the desired signal is known as the cochannel interference protection ratio. If an AFC with a $\pm 1000$ Hz range is used in a receiver, the cochannel interference protection ratio required is between 30 and 35 dB whereas if an AFC of $\pm 700$ Hz is used, the cochannel protection ratio requirement is reduced to 20 dB. In the preferred embodiment of this invention, a sweep range of $\pm 865$ Hz is utilized thereby allowing margin over the minimum $\pm 700$ Hz defined by a combined receiver-transmitter stability of $\pm 4$ ppm but not approaching a lock range which seriously degrades the required cochannel protection ratio.

Referring again to FIG. 1, a digitally-controlled sweep voltage generator 32 varies the oscillation frequency of a 14.4 MHz voltage controlled crystal reference oscillator (VCXO) 34 such that the synthesized local oscillator 36 frequency sweeps back and forth across the $\pm 865$ HZ so that a transmitted signal within this range can be positioned in the IF bandpass.

A received frequency is considered "centered" when the carrier and the single sideband modulation are contained within the IF filter bandpass and the demodulated frequency error is less than 100 Hz. Control of the sweep voltage generator 32 is exercised via five control lines from three detectors. These detectors, which will be described in more detail later, are the lock detector 38, the PLL VCXO control line direction comparator 40, and the combination of the digital squelch detector 42 and carrier squelch detector 44.

Because a desired carrier may appear outside the IF filter passband, the local oscillator frequency is swept across the entire AFC frequency range to enable the desired carrier to be found. In this particular embodiment, a digitally generated triangular voltage yields a $\pm 865$ Hz total frequency excursion at the local oscillator output in 256 discrete frequency steps of 6.7 Hz each. The rate of sweep has traditionally been established by the PLL natural frequency, such that the sweep frequency is less than one-half the square of the PLL natural frequency. Generally, this results in a slow sweep and unacceptably long signal centering times in conventional AFC implementations, particularly when the signal experiences the rapid fading common at VHF frequencies.

When a carrier first appears within the IF bandwidth of the receiver of FIG. 1, it may be momentarily at a level higher than the steady-state level it will attain when the AGC circuit 46 reduces the receiver gain in the well-known AGC operation. Typical AGC circuits are described in U.S. Pat. No. 4,013,964 and U.S. patent application Ser. No. 534,512 (Automatic Gain Control Responsive to Coherent and Incoherent Signals) filed in behalf of Eastmond on Sept. 21, 1983, both assigned to the assignee of the present application. This transient increase in the IF amplitude above the normal level may be augmented by a transmitter keying circuit which causes the single sideband transmitter to transmit at full peak envelope power for an initial period of time. It has been found possible to use higher sweep rates in the preferred receiver as a direct consequence of this transient increase in the IF amplitude. Specifically, both the natural frequency of the loop and the damping factor of the loop are related to the square root of incremental increases in level of the IF signal thereby allowing an increase in the sweep frequency because of the increase in natural loop frequency. Therefore, a sweep rate frequency of 15 Hz in the preferred embodiment allows reliable signal acquisition at threshold carrier levels as low as −134 dBm when a signal level boost is present. However, because the higher than normal signal is reduced when the detector PLL locks and the AGC operates, the sweep rate is reduced to a slower rate, for example 5 Hz, to permit reliable centering of the signal when the signal level attains its lower steady-state value.

If a long fade should cause the receiver to loose AFC lock and the signal subsequently returns, a signal strength boost may not be present. In this instance, the AFC sensitivity may be increased by holding the local oscillator sweep rate at the 5 HZ rate for a short period of time, which may be 2 seconds, following lock loss. This sweep rate hold is reset if the transmitter is keyed thereby permitting rapid signal acquisitions during message exchanges occurring in less than the hold period. Thus in the preferred embodiment, on long signal fades a high AFC sensitivity is briefly maintained which may be defeated by a keying of the transmitter.

Figure 2:
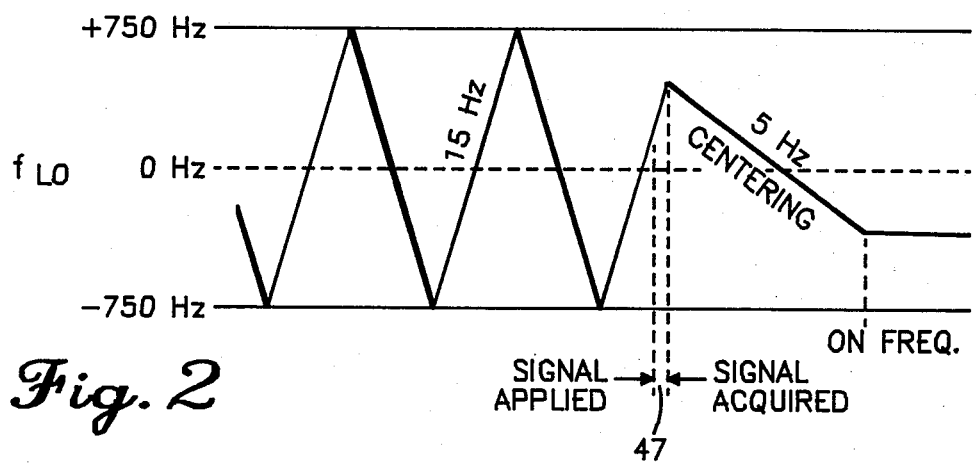
FIG. 2 is a graph of carrier frequency offset versus time showing the result of the dual sweep function of the present invention.

FIG. 2 diagrams the unique dual sweep voltage as a function of time. It can be seen that without a received signal, the sweep continues to vary the local oscillator frequency above and below its nominal frequency. When a signal is applied, the AFC acquires the signal within a lock time 47. At this point a slower, 5 Hz, sweep is applied in a direction indicated by direction control comparators 40 until the signal is centered and the "on-frequency" control line is activated.

Figure 3:
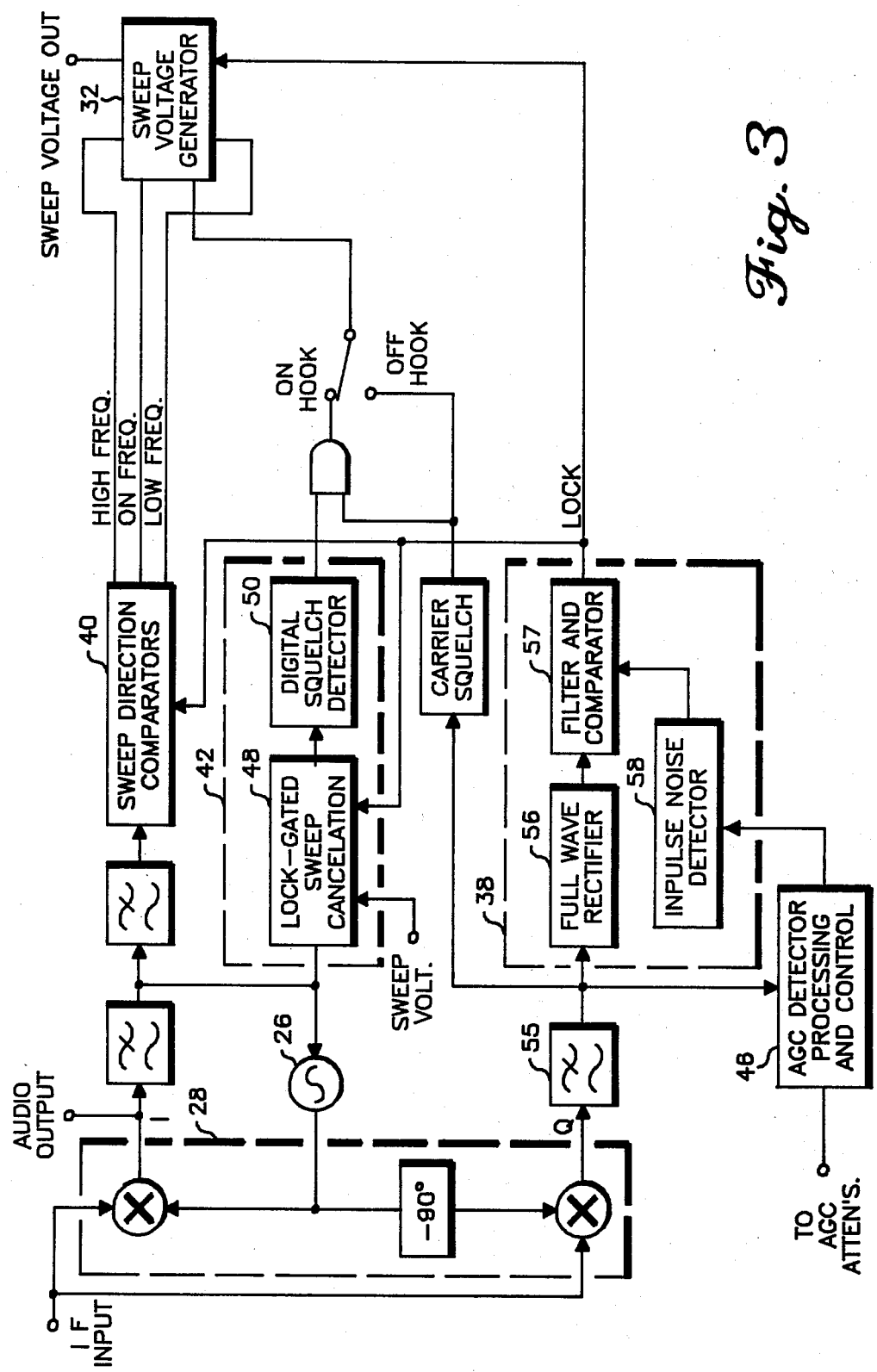
FIG. 3 is a block diagram of the AFC circuit in accordance with the present invention.

A more detailed block diagram of the AFC is shown in FIG. 3. As previously described, until a signal appears, the digital sweep voltage generator 32 sweeps the local oscillator frequency with a triangular waveform at a frequency of 15 Hz. When a signal appears and the AFC begins the acquisition process, the lock detector 38 senses the beat note between the centered frequency and the received signal and outputs a level or unitary output which causes the sweep voltage detector 32 to convert the sweep freqnency from 15 Hz to 5 Hz and which enables the direction control comparators 40 on the PLL VCXO 26 control line so as to provide information to the sweep voltage generator 32 indicating whether the desired signal is too high, too low, or centered on frequency. Once correct centering of the signal has been achieved, all sweep is stopped and squelch detect signals override all other inputs to the sweep controller thereby holding the local oscillator frequency constant. In this way noise present on the other control inputs is prevented from reaching the local oscillator and degrading the adjacent channel interference protection.

This use of a dual-frequency sweep improves the initial signal acquisition but the use of a slower centering sweep frequency has the potential of degrading the speed of squelch operation. Digital squelch is a common method of selective receiver muting in frequency modulation equipment used in the land mobile bands and typically consists of user-specific code words transmitted in an NRZ format at a low-speed bit rate, although higher speeds and modulated pilots may also be used. A single sideband system employing coded squelch is disclosed in U.S. patent application Ser. No. 564,815 Eastmond, et al. (A SSB System with Pilot Carrier Coded Squelch) filed in behalf of Eastmond, et al. on Dec. 22, 1983 and assigned to the assignee of the present application. Because of the data, the low frequency response of the transmission/reception medium must extend to nearly 1 Hz to ensure that the detection sensitivity is uniform for all codes. The input to the digital decoder incorporates a comparator which is referenced to the mean value of the data signal so as to avoid comparator "latch-up" at large steady state values of frequency offset. However, when the sweep voltage appears on the PLL VCXO 26 in addition to the desired signal, as it is during centering, digital squelch detection is disrupted because the mean value is changing fast enough under these conditions to cause comparator latch-up. It is not feasible to wait until centering is complete to begin digital squelch detection since this results in excessive squelch opening times. The lock gated sweep cancellation circuit 48 of the preferred embodiment permits digital squelch detection to commence at the start of the centering process.

Figure 4:
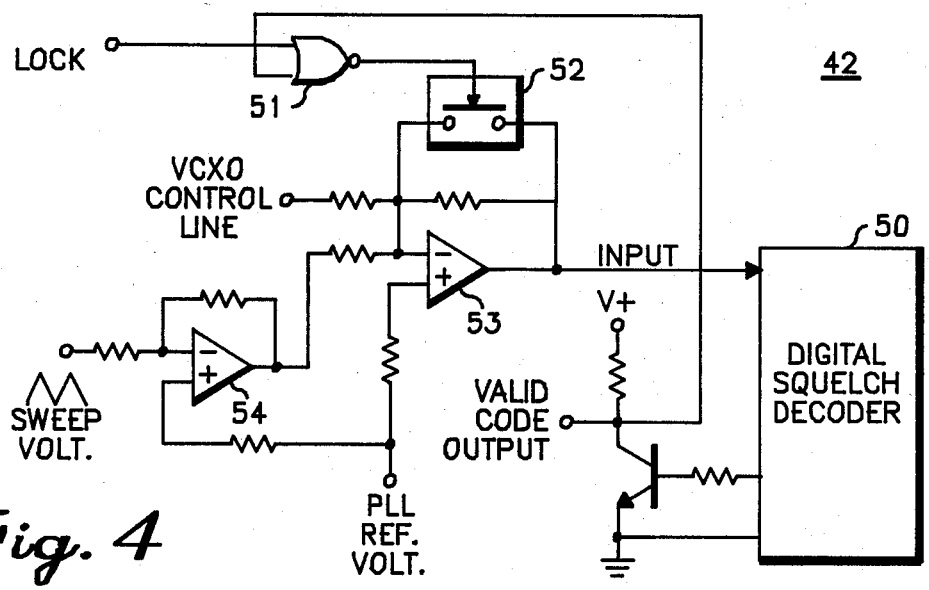
FIG. 4 is a block diagram of the digital squelch decoder and sweep cancellation circuit.

The sweep cancellation circuit is detailed in FIG. 4. A standard digital squelch decoder 50 (for example a TLN 2349A decoder manufactured by Motorola Inc.) is preceeded by a cancellation network which is enabled via "or" gate 51 from the lock detector 38 and switch 52 (which may be an MC14066UB circuit manufactured by Motorola Inc.). The sweep voltage and the phase detector 28 VCXO control line are connected via operational amplifiers 53, 54 to realize cancellation of the sweep voltage impressed on the phase detector 28 PLL VCXO control line by the sweep voltage at the input to the digital squelch decoder 50, thereby leaving a residual consisting of digital code to be detected. The digital code is not disturbed by the cancellation; thus, detection may begin as soon as the AFC acquires the signal. Prior to the cancellation process, the input to the digital squelch detector is maintained at the nominal center voltage of PLL VCXO 26 by the action of lock detector 38.

Returning to FIG. 3, the relation of the lock detector circuit 38 to the other structures of the receiver can be ascertained. Outputs from the lock detector 38 are connected to the sweep voltage generator 32 to cause the sweep frequency to convert from 15 Hz to 5 Hz, to the sweep direction comparators 40 to enable monitoring of the control line, and to the sweep cancellation circuit of the digital squelch detector to enable the sweep cancellation. Inputs to the lock detector 38 include a filtered (preferably via 3-pole 150 Hz corner Butterworth filter 55) signal from the Q output of phase detector 28 and an input from the AGC detector 46. The signal present at the Q output of the Phase detector 28 is a beat-note frequency equal to the difference between the received signal and the 10.8 Mhz PLL VCXO 26. This beat-note is filtered by the low pass filter 55 before being presented to the lock detector 38 so that signals greater than 150 Hz, which cannot be tracked by the quadrature detector PLL 26, do not cause a lock detection.

Figure 5:
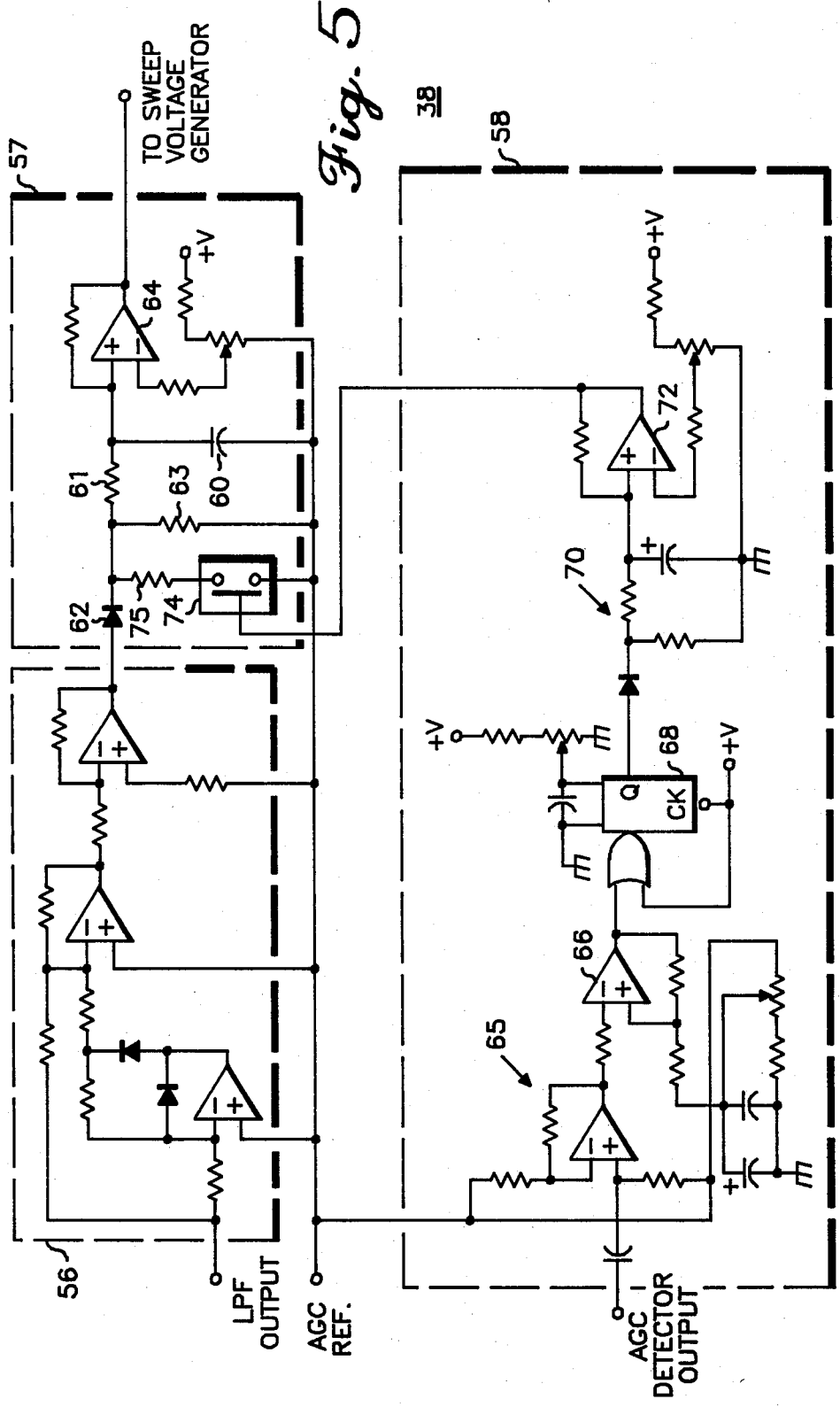
FIG. 5 is a block diagram of the lock detector and impulse noise detector.

Three major functions comprise the lock detector 38: a full wave rectifier 56, a filter and comparator 57, and an impulse noise detector 58. Referring now to FIG. 5, details of the preferred lock detector can be seen. Input is taken from the low pass filter 55 and full wave rectified by the conventional active full-wave rectifier 56. This novel use of a full-wave rectifier consisting of conventional operational amplifiers and diodes increases the reliability of the beat-note lock detector and ensures that transients due to excitation of the low pass filter 55 always enhance, rather than occasionally degrade, the reliability of the lock detector indication. Lock detection, or detection of AFC signal acquisition, is accomplished by a dual time constant low pass filter (consisting of a charge storing capacitor 60, a charging resistor 61, an isolating diode 62, and a discharge resistor 63) and a comparator 64, which can be an M2121 manufactured by Motorola Inc. and commonly associated circuitry. The selection of time constants for the filter includes consideration of detection speed and lock hold time. The detect time, or charge time, of the filter is a trade-off between a low falsing rate on noise and reliable beat-note detection at low carrier levels. The charge time constant used in the preferred embodiment is 12.5 msec which is large considering that the 15 Hz sweep frequency is equivalent to 52 Hz per msec over the nominal ±865 Hz sweep range but is feasible because the receiver is at a maximum AGC gain at the time of acquisition. The output of the dual time constant filter is therefore able to trigger the comparator 64 faster than a steady state AGC gain would allow because of the larger signal level.

The dual time constant filter decay time, or hold time, which is determined by capacitor 60 and the sum of resistor 63 and resistor 61, is important during signal fading. If the decay time were equal to the charge time, the lock detector would frequently fail after signal acquisition in the presence of fading, especially at high fading rates. After loosing lock, the local oscillator sweep would be forced to resume sweeping and an appreciable delay would be inserted into a voice transmission. In order not to degrade the charging time constant, the decay time was made independent of the charge time and long enough to hold lock indication through the signal fades. The decay time constant was experimentally optimized such that no failures of lock were observed with a simulated 70 MPH fading rate at VHF frequencies. This dictated a decay time of 165 msec.

Although the addition of a substantial hold time solved the problems encountered in a fading envorinment, it raised a question of whether the lock detector would latch-up when exposed to impulse noise such as ignition noise. Experiments proved that impulse noise would result in latch-up and result in acquisition problems under some conditions. Consequently, an impulse noise detector 58 was placed at the detector output of the AGC control circuit 46 in the preferred embodiment to detect the presence of impulse noise and to reduce the hold time of the dual time constant filter 56. The impulse noise detector 58 consists of a conventional single pole high pass active filter 65 with a corner at 32 Hz to remove the lower frequency modulation components such that the threshold of a standard comparator 66 which follows the filter 65 may be adjusted to singularly detect impulsive noise spikes. Because the resultant spikes at the comparator 66 are very short in duration, a monostable 68 (an MC14538B by Motorola Inc. or equivalent) in standard configuration is used to stretch these pulses prior to filtering. A dual time constant fast attack/slow decay filter 70 is used, like the dual time constant filter of the lock detector filter, to allow independence of attack and decay although the time constants of the impulse detector filter 70 may be made longer. The threshold of the conventional comparator 72 is set to provide a reliable detection level and the comparator 72 output is coupled to a semiconductor switch 74 in the lock detector dual time constant filter (which may be an MC14066UB manufactured by Motorola Inc.) which applies a resistor 75 in shunt with discharge resistor 63 in order to reduce the decay time constant in the presence of impulse noise.

Figure 6:
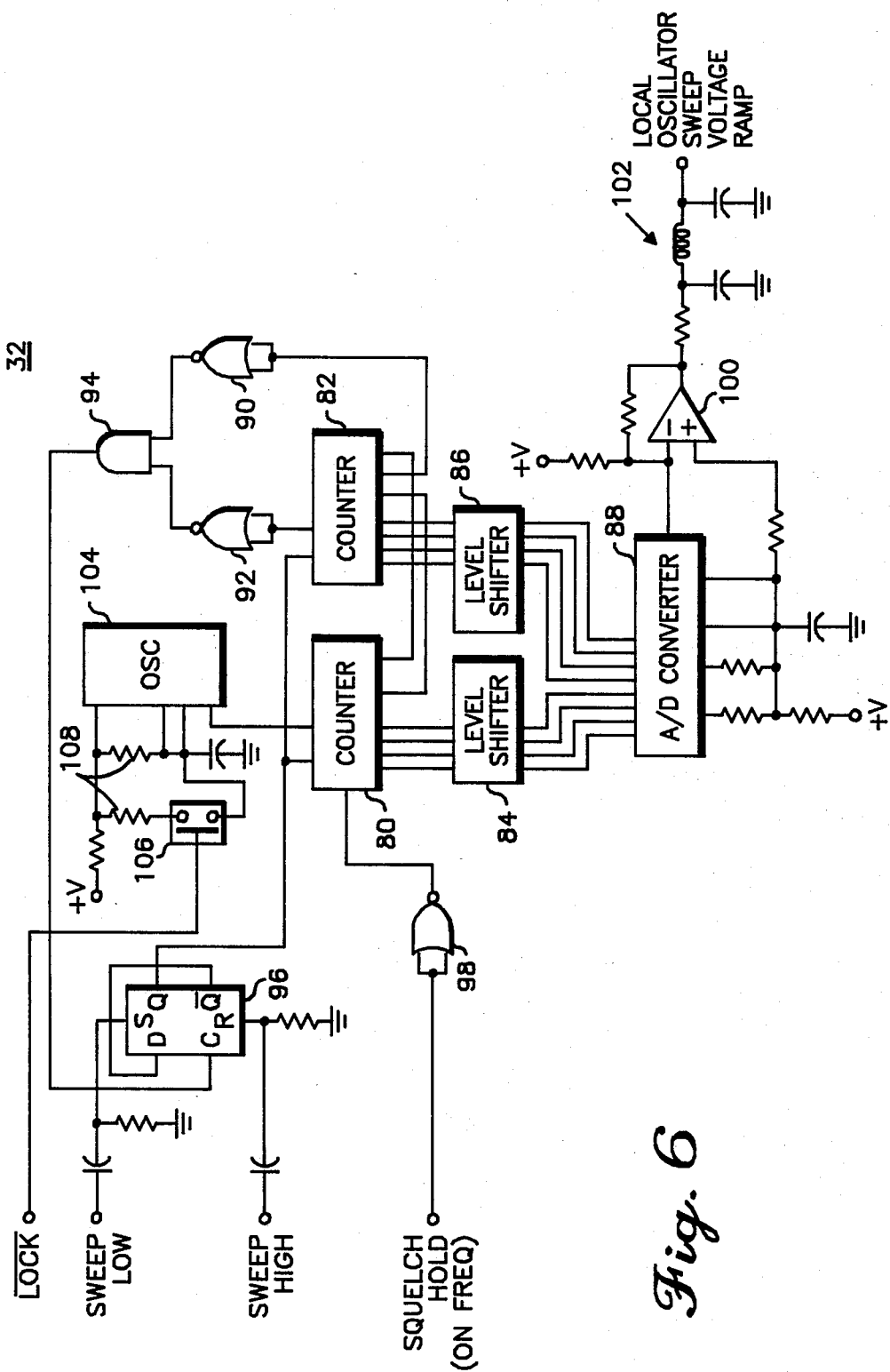
FIG. 6 is a schematic diagram of the digital sweep generator.

The digital sweep generator 32 schematic is shown in FIG. 6. This sweep generator is realized using two CMOS 4-bit up/down counters 80, 82 (such as an MC14516B manufactured by Motorola Inc.) configured to produce an 8-bit output which is sequentially incremented up and down between binary 0 and binary 255 in 256 increments. The output of the counters 80, 82 is level shifted in networks 84 and 86, which may be conventional diode-resistor networks, and passed to a digital-to-analog (D/A) converter 88. The carry output from the most significant bit counter 82 is inverted in "OR" gate 90 and "ANDED" with clock output of bit counter 82 via "OR" gate inverter 92 in "AND" gate 94 to control a conventional "D" flip-flop 96. The "Q" output from the flip-flop 96 controls the count direction (up or down) of the counters 80, 82. Flip-flop 96 is also toggled by a sweep low command signal input to the "set" port or by a sweep high command input to the "reset" port. Counting is halted by switching the carry-in port of the least significant bit counter 80 in response to an inverted (via "OR" gate 98) squelch hold signal.

The D/A converter 88 is an 8-bit multiplying D/A converter, such as an MC1508 manufactured by Motorola Inc., providing a current output which is a product of the digital word input and an analog reference voltage. Thus a triangular current waveform is generated by converter 88 as the counters 80, 82 count sequentially up and down. The current waveform is converted to a voltage sweep waveform by conventional operational amplifier 100 and coupled to the local oscillator reference VCXO 34 via RF filter 102.

An integrated circuit oscillator 104 (an MC1555 by Motorola Inc. or equivalent) is used as the clock for the counters and preferentially oscillates at a frequency 512 times the desired clock frequency. Since it is desired that two clock frequencies, 15 Hz and 5 Hz, be used in the radio local oscillator sweep, a switchable timing resistance is used in the RC timing circuit 108. An inverted lock indication from the lock detector 38 activates integrated circuit switch 106 (an MC14066UB manufactured by Motorola Inc.) which decreases the resistance in the timing circuit 108 and causes the time constant of the oscillator circuit to create a 2560 Hz frequency of oscillation rather than a 7680 Hz frequency of oscillation (corresponding to a 5 Hz and 15 Hz sweep respectively). The sweep frequency is subsequently coupled to the local oscillator reference VCXO 34 to vary the local oscillator frequency.

Figure 7:
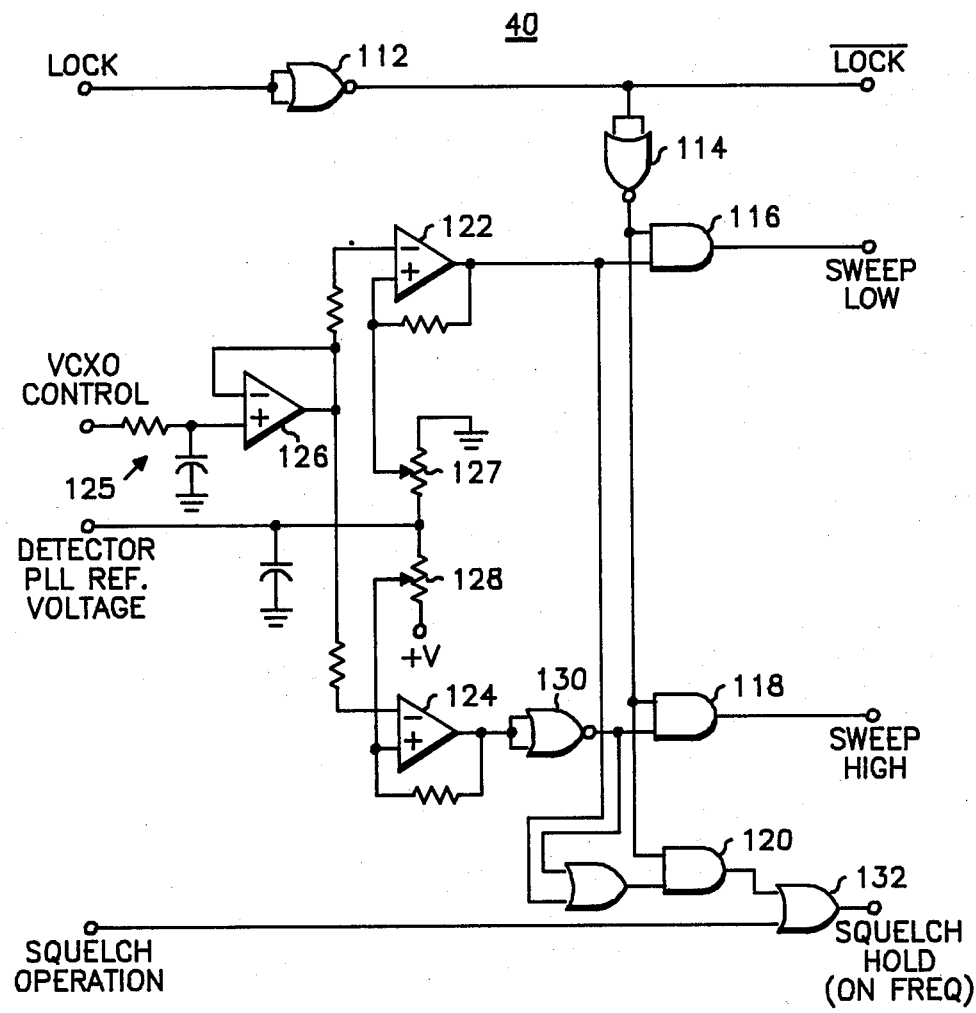
FIG. 7 is a schematic diagram of the control line direction detector.

Frequency sweep control inputs to the sweep voltage generator 32 come from the VCXO direction control comparators 40, shown in detail in FIG. 7. A lock signal from the lock detector 38 is input to inverter 112 and coupled to the switch 106 of sweep voltage generator 32. The inverted lock signal is reinverted by inverter 114 and coupled to one input of each "AND" gate 116, 118, 120 for sweep control. To determine whether the sweep should be positive or negative going, two comparators 122, 124 are used to detect positive control line excursions (comparator 124) or negative control line excursions (comparator 122). In the preferred embodiment, the comparators 122, 124 are part of an MC3302 quad single supply comparator but the comparator function could be performed by operational amplifiers equally successfully.

The VCXO control line input is filtered by a low pass filter 125 and isolated by amplifier 126 before being applied to the comparators 122, 124. The reference voltage for the direction control comparators 122, 124 is the same voltage as is used for the quadrature PLL phase detector 28 in order to avoid DC drift problems.

The threshold of the comparators 122 and 124 are set by potentiometers 127, 128 respectively so as to define a ±100 Hz "on-frequency" window which is justified to 0 Hz error by the detector PLL. The output of negative comparator 122 is "ANDED" with the lock signal in gate 116 and presented to the set port of "D" flip-flop 96 to cause the sweep frequency to increment sequentially lower when the threshold of comparator 122 is crossed. Alternately, the output of comparator 124, which is inverted in 130 is, "ANDED" with the lock signal in gate 118, and presented to the reset port of the flip-flop 96 to cause the sweep frequency to increment sequentially higher when the threshold of comparator 124 is crossed. An on-frequency signal, as determined by either a lock indication concurrent with neither sweep direction line being activated or a squelch detection, is made by "OR" gate 132 and coupled to the squelch hold (on-frequency) input of sweep voltage generator 32 via the inverted carry-in port of the up-/down counter 80.

Squelch detection, in the preferred embodiment, is a digital squelch detector 50 output but may also be a standard carrier squelch activation. In practical operation it is necessary to logically "and" the digital squelch and the carrier squelch to prevent noise falsing of the digital squelch system from being a problem. This "and-ing" degrades the opening times slightly at carrier levels below −132 dBm but since the minimum usable signal is −125 dBm or greater, this degredation is of no consequency. The results are well within the desired limits of signal acquisition and squelch opening performance and compare favorably with currently existing frequency modulation equipment for land mobile services. As one might expect, the squelch opening time becomes greater as the initial signal offset becomes greater.

While a particular embodiment of the invention has been described and shown, it should be understood that the invention is not limited thereto since many modifications may be made. It is therefore contemplated to cover by the present application any and all such modifications that fall within the true spirit and scope of the basic underlying principles disclosed and claimed herein.

We claim:

1. An automatic frequency control system for a single sideband radio receiver having a local oscillator, mixer, and IF bandpass and receiving a signal containing, inter alia, squelch activation information transmitted by a transmitter comprising:
   first means for varying the local oscillator frequency of the radio receiver at a first given rate;
   means, responsive to the local oscillator frequency, for acquiring the transmitted signal and indicating a direction in which said local oscillator frequency should be varied to essentially center the transmitted signal in the radio receiver IF bandpass;
   means, coupled to said means for acquiring, for detecting the squelch activation information;
   second means, coupled to said means for acquiring, for varying said local oscillator frequency of the radio receiver at a second given rate in said indicated direction; and
   means, coupled to said squelch activation information detection means, for ceasing variation of said local oscillator frequency by said first and second varying means and maintaining said frequency essentially constant.

2. An automatic frequency control system in accordance with claim 1 wherein said means for detecting the squelch activation information further comprises means for commencing detection of squelch activation information before the transmitted signal is centered.

3. An automatic frequency control system in accordance with claim 2 wherein said means for commencing detection of squelch activation information further comprises means for cancelling said second given rate local oscillator variation therein.

4. An automatic frequency control system in accordance with claim 1 wherein said means for acquiring the transmitted signal further comprises means for providing a beat note output when the transmitted signal is acquired.

5. An automatic frequency control system in accordance with claim 4 wherein said means for acquiring the transmitted signal further comprises means for full wave rectification of said beat-note output.

6. An automatic frequency control system in accordance with claim 5 wherein said means for acquiring the transmitted signal further comprises means for generating a unitary output when said beat-note rectification reaches a predetermined level thereby activating said means for detecting the squelch activation information.

7. An automatic frequency control system in accordance with claim 6 wherein said means for acquiring the transmitted signal further comprises means for maintaining said unitary output for a predetermined period of time after said beat-note rectification falls below said predetermined level thereby providing hysteresis in said unitary output.

8. An automatic frequency control system in accordance with claim 7 wherein said means for maintaining said unitary output further comprises means, sensitive to impulse noise received with the transmitted signal, for modifying said predetermined unitary output maintainance time.

9. An automatic frequency control circuit for a single sideband radio receiver having a local oscillator, mixer, and IF bandpass and which receives a signal transmitted by a transmitter and detects squelch information in the transmitted signal comprising:
   means for varying the local oscillator frequency of the radio receiver;
   means, responsive to the local oscillator frequency, for acquiring the transmitted signal and indicating a direction in which the local oscillator frequency should be varied to essentially center the transmitted signal in the radio receiver IF bandpass;
   means, coupled to said means for acquiring, for commencing detection of squelch information from the transmitted signal when the signal is acquired and for removing said local oscillator frequency variation from the squelch information; and
   means for deactivating said local oscillator frequency varying means in response to said squelch detection.

10. An automatic frequency control circuit in accordance with claim 9 wherein said means for acquiring the transmitted signal further comprises means for providing a beat note output when the signal is acquired.

11. An automatic frequency control circuit in accordance with claim 10 wherein said means for acquiring the transmitted signal further comprises means for full-wave rectification of said beat-note output.

12. An automatic frequency control circuit in accordance with claim 11 wherein said means for acquiring the transmitted signal further comprises means for generating a unitary output when said beat-note rectification reaches a predetermined value and maintaining said unitary output for a predetermined period of time after said beat-note rectification falls below said predetermined value.

13. An automatic frequency control circuit in accordance with claim 12 wherein said means for acquiring the transmitted signal further comprises means, sensitive to impulse noise received with the transmitted signal, for modifying said unitary output maintainance time.

14. An automatic frequency control circuit for a single sideband radio receiver in which a local oscillator is varied in frequency to acquire a transmitted signal containing, inter alia, squelch activation information, the automatic frequency control circuit comprising:
  means for varying the local oscillator frequency of the radio receiver at a first given rate;
  means, responsive to the local oscillator frequency, for determining the acquisition of the transmitted signal and providing a beat-note output when the signal is acquired;
  means for full-wave rectification of said beat-note output;
  means for providing a unitary output when said beat-note rectification reaches a predetermined value;
  means, responsive to said unitary output, for varying the local oscillator frequency at a second given rate; and
  means for maintaining said unitary output for a predetermined period of time after said beat-note rectification falls below said predetermined value thereby providing hysteresis in said unitary output.

15. An automatic frequency control circuit in accordance with claim 14 wherein said automatic frequency control circuit further comprises means for commencing detection of squelch activation information from the transmitted signal when the signal is acquired.

16. An automatic frequency control circuit in accordance with claim 14 wherein said automatic frequency control circuit further comprises means, sensitive to impulse noise received with the transmitted signal, for modifying said predetermined period of unitary output maintainance time.

17. An automatic frequency control circuit for a single sideband radio receiver having a local oscillator, mixer, and IF bandpass and receiving a signal transmitted by a transmitter, comprising:
  first means for varying the local oscillator frequency of the radio receiver at a first given rate;
  means, responsive to the local oscillator frequency, for acquiring the transmitted signal and providing a beat-note output in response thereto;
  means for full-wave rectification of said beat-note output;
  means for providing a unitary output when said beat-note rectification reaches a predetermined value;
  means responsive to said unitary output for ceasing said first local oscillator variation at a first rate, and for indicating a direction the local ocsillator frequency should be varied to essentially center the transmitted signal in the radio receiver IF bandpass;
  second means, responsive to said unitary output and indicated direction, for varying said local oscillator frequency of the radio receiver at a second given rate in said indicated direction;
  means, coupled to said means for acquiring, for commencing detection of squelch information from the transmitted signal before the signal is centered; and
  means for deactivating said second varying means in response to said squelch detection.

18. An automatic frequency control circuit in accordance with claim 17 wherein said frequency control circuit further comprises means for maintaining unitary output for a predetermined period of time after said beat-note rectification falls below said predetermined value.

19. An automatic frequency control circuit in accordance with claim 18 wherein said automatic frequency control circuit further comprises means, sensitive to impulse noise received with the transmitted signal, for modifying said predetermined period of unitary maintainance time.

20. A method of controlling the frequency of a single sideband radio receiver having a local oscillator, mixer, and IF bandpass and receiving a signal containing, inter alia, squelch activation information transmitted by a transmitter comprising the steps of:
  varying the frequency of the local oscillator of the receiver at a first given rate;
  acquiring the transmitted signal in cooperation with the local oscillator and indicating a direction in which said local oscillator frequency should be varied to essentially center the transmitted signal in the radio receiver IF bandpass;
  detecting the squelch activation information;
  varying said local oscillator frequency at a second given rate in said indicated direction in response to said transmitted signal acquiring step thereby centering the signal; and
  ceasing said first and second rates of local oscillator frequency variation, in response to squelch activation information detection, and maintaining said local oscillator frequency at a point where the transmitted signal is essentially centered when said squelch activation information detection occurs.

21. A method for controlling frequency in accordance with the method of claim 20 further comprising the step of commencing detection of squelch activation information before the transmitted signal is centered.

22. A method of controlling frequency in accordance with the method of claim 20 wherein the step of acquiring the transmitted signal further comprises the steps of providing a beat-note, rectifying said beat-note, and generating a unitary output when said beat-note rectification reaches a predetermined value.

23. A method of controlling frequency in accordance with the method of claim 22 wherein the step of acquiring the transmitted signal further comprises the step of maintaining said unitary output for a predetermined period of time.

24. A method of controlling frequency in accordance with claim 23 wherein the step of acquiring the transmitted signal further comprises the step of modifying said predetermined unitary output maintainance time in response to impulse noise received with the transmitted signal.

* * * * *

UNITED STATES PATENT AND TRADEMARK OFFICE
CERTIFICATE OF CORRECTION

PATENT NO. : 4,625,331

DATED : Nov. 25, 1986

INVENTOR(S) : Julian H. Richardson, Bruce C. Eastmond

It is certified that error appears in the above-identified patent and that said Letters Patent is hereby corrected as shown below:

Column 11, line 63, "ocsillator" should read --oscillator--.

Column 12, line 12, after the word "maintaining" insert --said--.

Column 12, line 20, between "unitary" and "maintenance" insert --output--.

In the Title: "OR" should read --FOR--.

Signed and Sealed this

Seventeenth Day of March, 1987

Attest:

DONALD J. QUIGG

Attesting Officer

Commissioner of Patents and Trademarks